United States Patent
Hsiao et al.

(10) Patent No.: US 10,020,393 B2
(45) Date of Patent: Jul. 10, 2018

(54) LATERALLY DIFFUSED METAL-OXIDE-SEMICONDUCTOR TRANSISTOR AND MANUFACTURING METHOD THEREOF

(71) Applicant: UNITED MICROELECTRONICS CORP., Hsin-Chu (TW)

(72) Inventors: Shih-Yin Hsiao, Chiayi County (TW); Chia-Min Hung, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 40 days.

(21) Appl. No.: 14/886,108

(22) Filed: Oct. 19, 2015

(65) Prior Publication Data

US 2017/0084739 A1    Mar. 23, 2017

(30) Foreign Application Priority Data

Sep. 17, 2015  (CN) .......................... 2015 1 0593413

(51) Int. Cl.
| | | |
|---|---|---|
| *H01L 29/78* | (2006.01) | |
| *H01L 29/24* | (2006.01) | |
| *H01L 29/06* | (2006.01) | |
| *H01L 29/417* | (2006.01) | |
| *H01L 29/66* | (2006.01) | |
| *H01L 21/4763* | (2006.01) | |
| *H01L 21/471* | (2006.01) | |
| *H01L 21/4757* | (2006.01) | |
| *H01L 21/441* | (2006.01) | |

(52) U.S. Cl.
CPC ........ *H01L 29/7823* (2013.01); *H01L 21/441* (2013.01); *H01L 21/471* (2013.01); *H01L 21/4763* (2013.01); *H01L 21/47573* (2013.01); *H01L 21/47635* (2013.01); *H01L 29/0611* (2013.01); *H01L 29/0653* (2013.01); *H01L 29/24* (2013.01); *H01L 29/41725* (2013.01); *H01L 29/66969* (2013.01)

(58) Field of Classification Search
CPC . H01L 29/404; H01L 29/407; H01L 29/7823; H01L 27/0727
See application file for complete search history.

(56) References Cited

U.S. PATENT DOCUMENTS 6,445,019 B2 * 9/2002 Van Dalen ............ H01L 29/404
                                                          257/217
7,087,959 B2 * 8/2006 Shibib .................. H01L 29/407
                                                          257/335

(Continued)

*Primary Examiner* — Yu Chen
*Assistant Examiner* — Vincent Wall
(74) *Attorney, Agent, or Firm* — Winston Hsu

(57) ABSTRACT

The present invention provides a laterally diffused metal-oxide-semiconductor (LDMOS) transistor and a manufacturing method thereof. The LDMOS transistor includes a semiconductor substrate, an insulation structure, agate structure, and a plurality of floating electrodes. The insulation structure is disposed in the semiconductor substrate. The gate structure is disposed on the semiconductor substrate. The floating electrodes are embedded in the insulation structure, wherein the floating electrode closest to the gate structure protrudes from a top surface of the insulation structure or the gate structure includes at least one branch portion embedded in the insulation structure, and the floating electrodes are separated from the gate structure.

10 Claims, 13 Drawing Sheets

(56) References Cited

U.S. PATENT DOCUMENTS

| | | | |
|---|---|---|---|
| 7,423,325 B2* | 9/2008 | Tihanyi | H01L 29/0634 257/368 |
| 8,704,304 B1 | 4/2014 | Yu | |
| 8,729,631 B2* | 5/2014 | Yu | H01L 29/404 257/343 |
| 2005/0082610 A1* | 4/2005 | Shibib | H01L 29/0634 257/335 |
| 2006/0270171 A1* | 11/2006 | Chen | H01L 29/407 438/297 |
| 2007/0187781 A1* | 8/2007 | Kocon | H01L 29/7824 257/408 |
| 2009/0032868 A1* | 2/2009 | Chen | H01L 29/7817 257/336 |
| 2013/0277742 A1* | 10/2013 | Lee | H01L 29/7816 257/343 |
| 2014/0097492 A1* | 4/2014 | Yu | H01L 29/404 257/343 |
| 2014/0225192 A1* | 8/2014 | Lee | H01L 29/7816 257/339 |
| 2014/0339632 A1* | 11/2014 | Yu | H01L 29/404 257/339 |

* cited by examiner

LATERALLY DIFFUSED METAL-OXIDE-SEMICONDUCTOR TRANSISTOR AND MANUFACTURING METHOD THEREOF

BACKGROUND OF THE INVENTION

1. Field of the Invention

The present invention relates to a laterally diffused metal-oxide-semiconductor (LDMOS) transistor and a manufacturing method thereof, and more particularly, to an LDMOS transistor used for improving breakdown voltage and a manufacturing method thereof.

2. Description of the Prior Art

Laterally diffused metal-oxide-semiconductor (LDMOS) transistor has become a common semiconductor power device and has been widely applied to power converters, power amplifiers, switches or rectifiers because of being able to endure high breakdown voltage, have good switching efficiency and operate under a low resistance. In addition, the LDMOS transistor has planar structure, which is easy to be produced and to be integrated with the current semiconductor technology, so that the production cost of which is reduced. Generally, the drain of the LDMOS transistor is electrically connected to the high voltage during operating. Thus, in the conventional LDMOS transistor, an insulation structure is designed to be disposed between the drain and the gate to endure the high electric field generated by the high voltage and avoid the LDMOS transistor from breaking down. However, the high electric field may be concentrated at the adjacent area of the drain, the insulation structure and the well region, which limits the breakdown voltage of the LDMOS transistor. Therefore, it is a common goal in this field to provide an LDMOS transistor and a manufacturing method thereof with high breakdown voltage.

SUMMARY OF THE INVENTION

An objective of the present invention is to provide a laterally diffused metal-oxide-semiconductor (LDMOS) transistor and a manufacturing method thereof to increase the breakdown voltage.

According to an exemplary embodiment, an LDMOS transistor is provided. The LDMOS transistor includes a semiconductor substrate, an insulation structure, a well region, a first doped region, a second doped region, a gate structure and a plurality of first floating electrodes. The semiconductor substrate includes a first conductivity type. The insulation structure is disposed in the semiconductor substrate. The well region is disposed in the semiconductor substrate at a first side of the insulation structure, wherein the well region includes a second conductivity type complementing the first conductivity type. The first doped region is disposed in the semiconductor substrate at a second side of the insulation structure opposite the first side, wherein the first doped region includes the first conductivity type. The second doped region is disposed in the well region, wherein the second doped region includes the first conductivity type. The gate structure is disposed on the semiconductor substrate between the well region and the insulation structure. The first floating electrodes are embedded in the insulation structure and are arranged from the first side to the second side, wherein one of the first floating electrodes closest to the well region protrudes from a top surface of the insulation structure, and the floating electrodes are separated from the gate structure.

According to another exemplary embodiment, a manufacturing method of an LDMOS transistor is provided. First, a semiconductor substrate, a well region, an insulation structure and a first doped region are provided, wherein the semiconductor substrate includes a first conductivity type, the insulation structure is disposed in the semiconductor substrate, the well region includes a second conductivity type and is disposed in the semiconductor substrate at a first side of the insulation structure, and the first doped region includes the first conductivity type and is disposed in the semiconductor substrate at a second side of the insulation structure opposite the first side. Then, a plurality of trenches is formed within the insulation structure. Subsequently, a conductive layer is formed to cover the semiconductor substrate and the insulation structure, and the conductive layer fills the trenches. After that, a photoresist pattern is formed on the conductive layer, the photoresist pattern includes a first photoresist block and at least a second photoresist block, wherein the first photoresist block overlaps the semiconductor substrate between the well region and the insulation structure, and the second photoresist block covers one of the trenches closest to the well region. Then, the photoresist pattern is used as a mask to perform an etching process to form a gate under the first photoresist block and to form a first floating electrode in each of the trenches respectively, wherein one of the first floating electrodes closest to the well region is disposed corresponding to the second photoresist block and protrudes from a top surface of the insulation structure. Subsequently, the photoresist pattern is removed.

According to another exemplary embodiment, an LDMOS transistor is provided. The LDMOS transistor includes a semiconductor substrate, an insulation structure, a well region, a first doped region, a second doped region, a gate structure and a plurality of first floating electrodes. The semiconductor substrate includes a first conductivity type. The insulation structure is disposed in the semiconductor substrate. The well region is disposed in the semiconductor substrate at a first side of the insulation structure, wherein the well region includes a second conductivity type complementing the first conductivity type. The first doped region is disposed in the semiconductor substrate at a second side of the insulation structure opposite the first side, wherein the first doped region includes the first conductivity type. The second doped region is disposed in the well region, wherein the second doped region includes the first conductivity type. The gate structure is disposed on the semiconductor substrate between the well region and the insulation structure, and the gate structure includes at least a branch embedded in the insulation structure. The first floating electrodes are embedded in the insulation structure and are arranged from the first side to the second side.

According to another exemplary embodiment, a manufacturing method of an LDMOS transistor is provided. First, a semiconductor substrate, a well region, an insulation structure and a first doped region are provided, wherein the semiconductor substrate includes a first conductivity type, the insulation structure is disposed in the semiconductor substrate, the well region includes a second conductivity type and is disposed in the semiconductor substrate at a first side of the insulation structure, and the first doped region includes the first conductivity type and is disposed in the semiconductor substrate at a second side of the insulation structure opposite the first side. Then, a plurality of trenches is formed within the insulation structure. Subsequently, a conductive layer is formed to cover the semiconductor substrate and the insulation structure, and the conductive layer fills the trenches. After that, a photoresist pattern is formed on the conductive layer, wherein the photoresist block overlaps the semiconductor substrate between the well region and the insulation structure, and extends to cover at least one of the trenches. Then, the photoresist pattern is used as a mask to perform an etching process to form a gate and a plurality of floating electrodes, wherein the gate is formed on the insulation structure and includes at least a branch filling the at least one of trenches, the floating electrodes fills others of the trenches and is arranged from the first side to the second side, and the gate and the floating electrodes are separated from each other. Subsequently, the photoresist pattern is removed.

In the LDMOS transistor of the present invention, since the floating electrodes are in the floating state and are embedded in the first insulation structure sequentially arranged from the inner side to the outer side, and one of the floating electrodes closest to the gate protrudes from the top surface of the first insulation structure, or the gate may include the branch embedded in the first insulation structure, the floating electrodes may be capacitively coupled with the second well region or the semiconductor substrate under the first insulation structure, and one of the floating electrodes closest to the gate may be capacitively coupled with the gate. Thus, the voltage difference between the drain and the gate may be dispersed between the floating electrodes, and the breakdown voltage of the LDMOS transistor can be increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
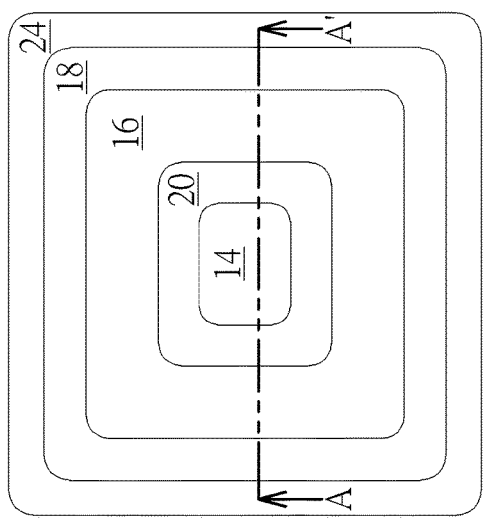
FIG. 1 to FIG. 6 are schematic diagrams illustrating a manufacturing method of an LDMOS transistor according to a first embodiment of the present invention.
Figure 2:
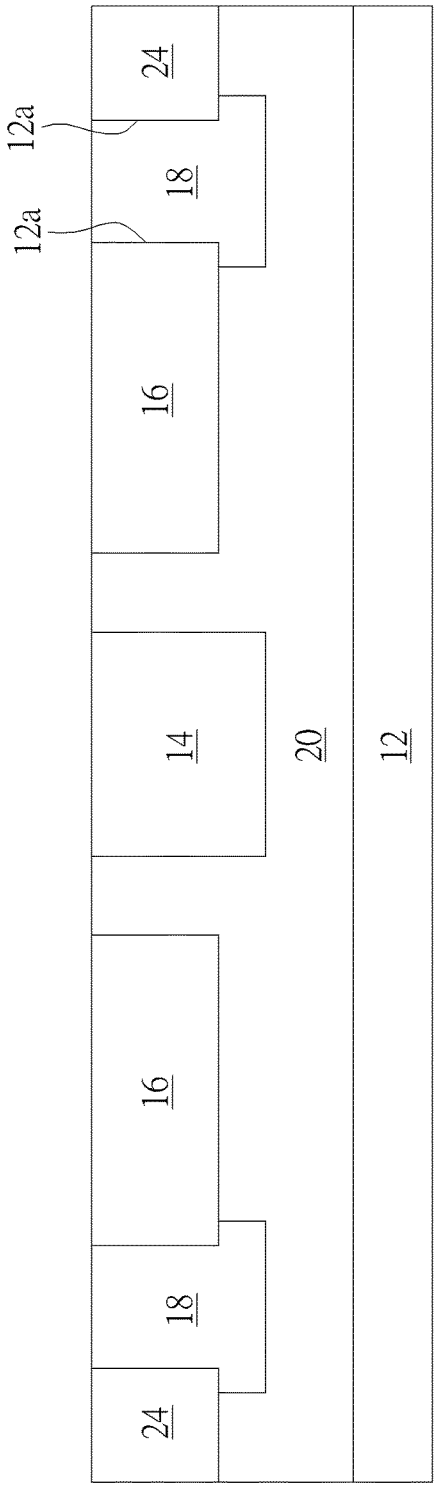
Figure 4:
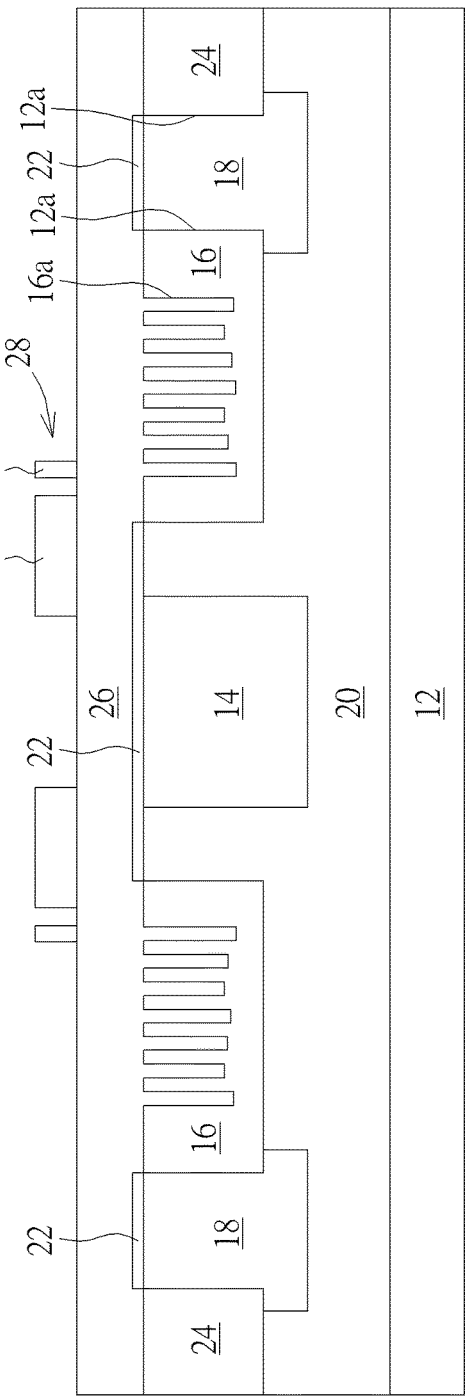
Figure 5:
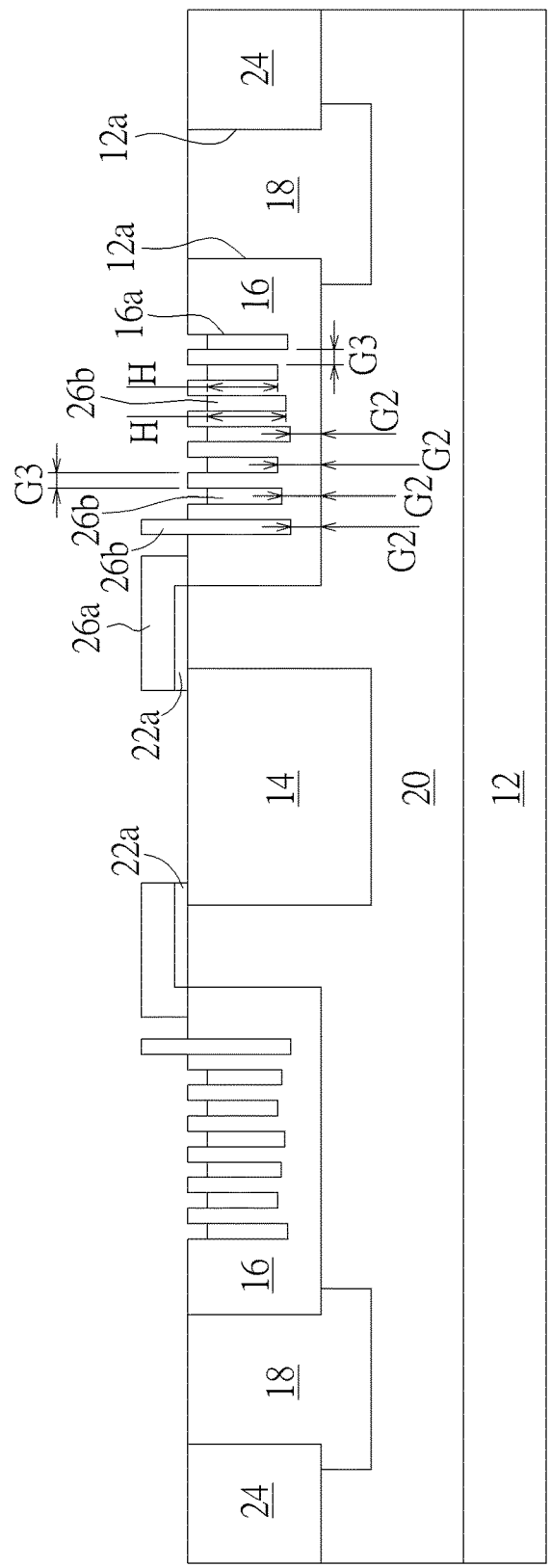
Figure 6:
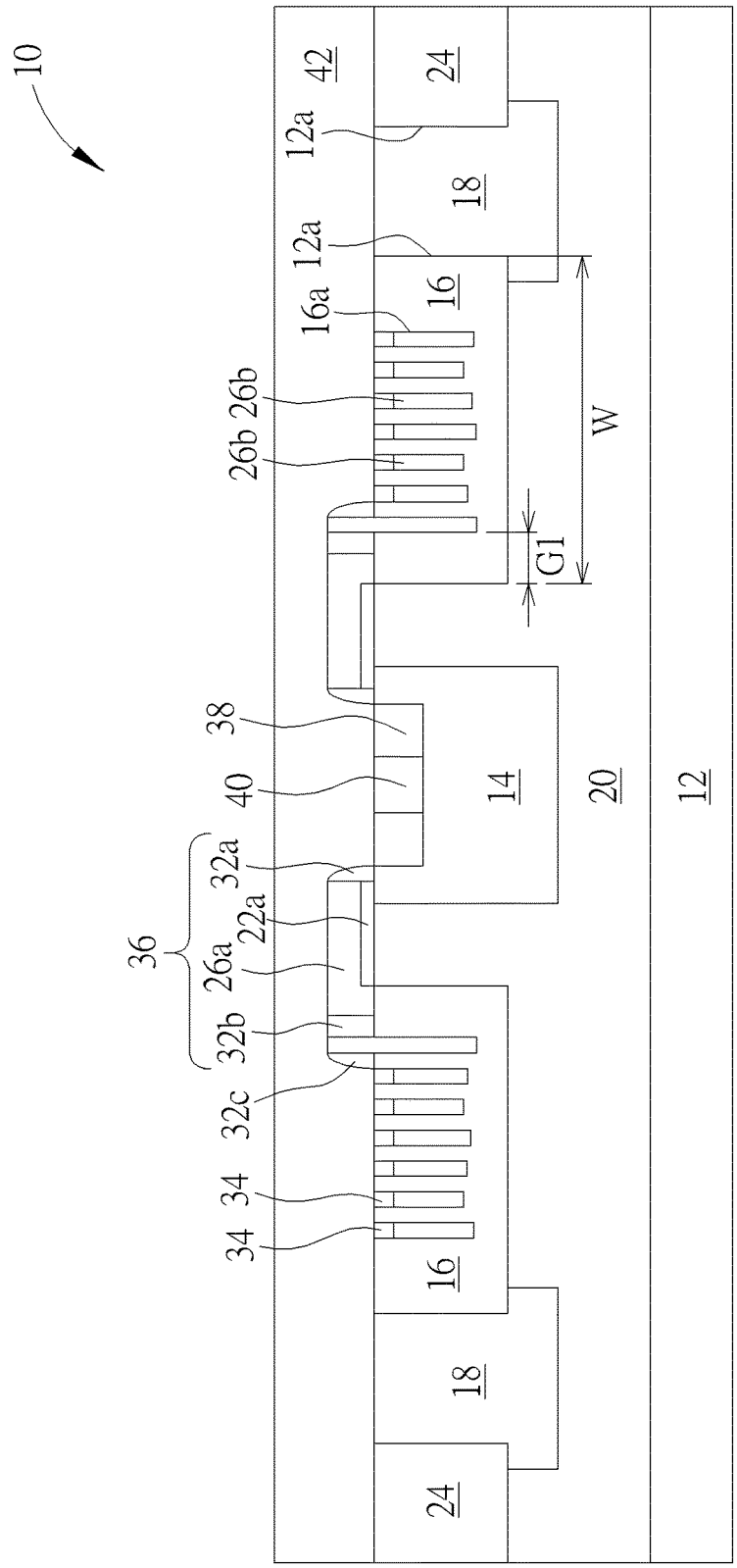

Refer to FIGS. 1-6, which are schematic diagrams illustrating a manufacturing method of a laterally diffused metal-oxide-semiconductor (LDMOS) transistor according to a first embodiment of the present invention, wherein FIG. 2 is a cross-sectional view diagram taken along line A-A' of FIG. 1, FIG. 6 is a cross-sectional view diagram illustrating the LDMOS transistor according to the first embodiment of the present invention. As shown in FIGS. 1-2, first, a semiconductor substrate 12, a first well region 14, a first insulation structure 16 and a first doped region 18 are provided. In the present embodiment, the semiconductor substrate 12 may include a silicon substrate, an epitaxial silicon substrate, a silicon germanium substrate, a silicon carbide substrate or a silicon-on-insulator (SOI) substrate, but not limited thereto. For instance, the semiconductor substrate 12 may include a first conductivity type or a second conductivity type complementing the first conductivity type, and a second well region 20 including the first conductivity type may be formed in the semiconductor substrate 12 before the first well region 14 is formed, but the present invention is not limited thereto. In another embodiment, the semiconductor substrate may not have the second well region formed therein, and the semiconductor substrate includes the first conductivity type. In another embodiment, the semiconductor substrate may include a fin structure (not shown in figures) of a fin field effect transistor (FinFET). The fin structure may be formed by photolithography and etching processes or multi patterning processes. Preferably, the fin structure may be formed by a spacer self-aligned double-patterning (SADP) method, in other words, a sidewall image transfer (SIT) method to pattern a bulk silicon substrate or a monocrystalline silicon layer in the surface of the SOI substrate, and forming a fin shape silicon thin film in the bulk silicon substrate or the SOI substrate, but not limited thereto.

For example, after the second well region 20 is formed, the first well region 14 including the second conductivity type is formed in the second well region 20 and serves as a base region of the LDMOS transistor 10. Then, the first insulation structure 16 and a second insulation structure 24 are formed in the second well region 20, wherein the first well region 14 is disposed in the second well region 20 or the semiconductor substrate 20 at a first side of the first insulation structure 16. Specifically, the first insulation structure 16 surrounds the first well region 14, and the second insulation structure 24 surrounds the first insulation structure 16. Those skilled in the art should be aware that the first insulation structure 16 and the second insulation structure 24 may be shallow trench isolation (STI) structures respectively, which may be formed for example by using a patterned mask (not shown in the figures) to form a first trench 12a in the exposed semiconductor substrate 12, then filling an insulation material in the first trench 12a to form the first insulation structure 16 and the second insulation structure 24, but not limited thereto. In another embodiment, the first insulation structure and the second insulation structure may also be field oxides (FOXs), and the first insulation structure and the second insulation structure may be formed by a local oxidation of silicon (LOCOS) method.

After the first insulation structure 16 and the second insulation structure 24 are formed, the first doped region 18 may be formed in the second well region 20 at a second side (i.e., outer side) of the insulation structure 16 opposite the first side (i.e., the inner side). The concentration of the first doped region 18 is higher than the concentration of the second well region 20 or the concentration of the semiconductor substrate 12, so that the first doped region 18 may serve as the drain doped region of the LDMOS transistor 10 electrically connected to the high voltage power source, and the second well region 20 or the semiconductor substrate 12 may be used to withstand a high electric field generated by the high voltage power source. Specifically, the first doped region 18 is disposed between the first insulation structure 16 and the second insulation structure 24, and surrounds the first insulation structure 16, and the first well region 14 is disposed in the second well region 20 or the semiconductor substrate 12 at the first side of the first insulation structure 16. Preferably, the bottom surface of the first doped region 18 is lower than the bottom surface of the first insulation structure 16. The method for forming the semiconductor substrate, the first well region, the first insulation structure and the first doped region described above is an example, those skilled in the art should be aware that the method is not limited to the above-mentioned example.

Figure 3:
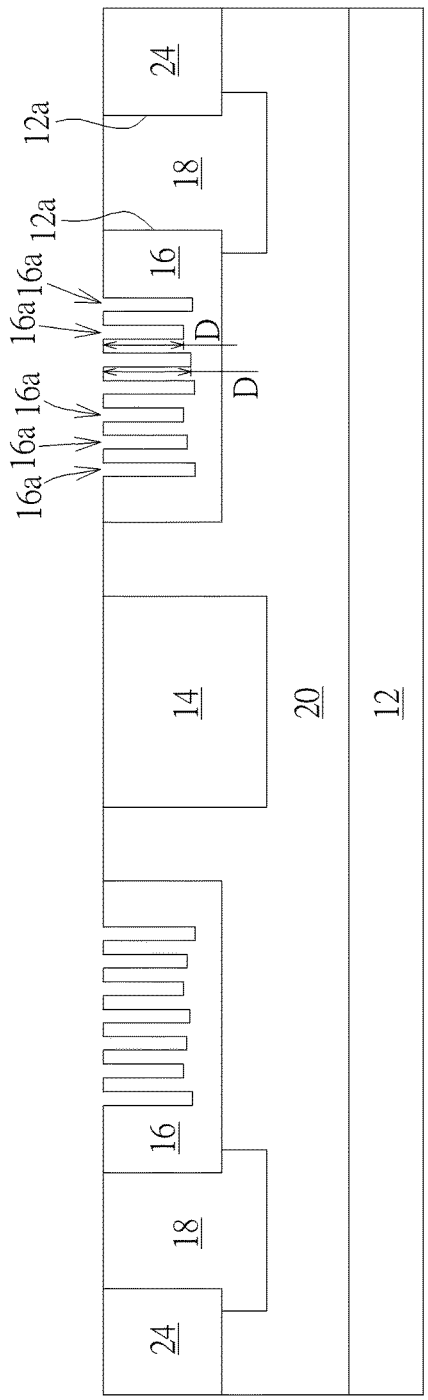

As shown in FIG. 3, a photolithography process and an etching process are performed to form a plurality of second trenches 16a in the first insulation structure 16, and the second trenches 16a are arranged from the first side to the second side. In the present embodiment, the second trenches 16a do not penetrate the first insulation structure 16, and the second trenches 16a are ring trenches respectively, which are sequentially arranged from the inner side to the outer side. The number of the second trenches 16a depends on the width of the first insulation structure 16 and the limit of the photolithography process. In the present embodiment, a spacing exists between any two of the second trenches 16a adjacent to each other, and the spacings may be identical, but not limited thereto. In another embodiment, at least two of the spacings may be different from each other. In addition, when the second trenches 16a are formed near the limit of the photolithography process, the depth D of each of the second trenches 16a is not easy to control, and thus the depths D of the second trenches 16a of the present embodiment may be different from one another, i.e., the spacings between the bottom surfaces of the second trenches 16a and the second well region 20 or the semiconductor substrate 12 thereunder may be different from one another, but the present invention is not limited thereto. In another embodiment, the depths of the second trenches may be identical to each other, and the spacings between the bottom surfaces of the second trenches and the second well region or the semiconductor substrate thereunder may be identical to each other.

As shown in FIG. 4, a dielectric layer 22 is then formed on the exposed semiconductor substrate 12. Next, a conductive layer 26 is formed on the dielectric layer 22, the first insulation structure 16 and the second insulation structure 24, and the conductive layer 26 fills up the second trenches 16a. Preferably, a polishing process may be performed to planarize a top surface of the conductive layer 26. Subsequently, a photoresist layer (not shown) covers the conductive layer 26, and patterning the photoresist layer to form a photoresist pattern 28 via a photolithography process, wherein the photoresist pattern 28 includes a first photoresist block 28a and at least a second photoresist block 28b. The first photoresist block 28a covers the semiconductor substrate 12 between the first well region 14 and the first insulation structure 16 in a vertical direction perpendicular to a top surface of the semiconductor substrate 12, and the second photoresist block 28b covers one of the second trenches 16a closest to the first well region 14 in the direction.

As shown in FIG. 5, the photoresist pattern 28 is used as a mask to perform an etching process to form a gate 26a under the first photoresist block 28a, and to form a first floating electrode 26b in each of the second trenches 16a respectively. Next, a part of the dielectric layer 22 which is not covered with the gate 26a is removed to form a gate dielectric layer 22a between the gate 26a and the semiconductor substrate 12. Then, the photoresist pattern 28 is removed. In the present embodiment, the etching process may be a dry etching process, for example, and the conductive layer 26 without being covered with the photoresist pattern 28 and located at the outside of the first insulation structure 16 may be removed by controlling conditions of the etching process, such as etching time and etching rate, and a portion of the conductive layer 26 remains in each of the second trenches 16a and under the first photoresist block 28a respectively. Wherein, the gate 26a consists of the conductive layer 26 remaining under the first photoresist block 28a, each of the first floating electrodes 26b consists of the conductive layer 26 remaining in each of the second trenches 16a, and the one of the first floating electrodes 26b closest to the gate 26a protrudes from a top surface of the first insulation structure 16. In addition, the first floating electrodes 26b are parallel to each other, and are arranged from the first side to the second side. In another embodiment, the step of removing the dielectric layer without being covered with the gate may be performed after removing the photoresist pattern. Alternatively, the dielectric layer may not be removed and may be used directly as a gate dielectric layer.

Specifically, the first photoresist block 28a and the second photoresist block 28b are separated from each other, and thus the formed gate 26a is separated from the one of the first floating electrodes 26b closest to the first well region 14. Further, since the first floating electrodes 26b are formed in different second trenches 16a respectively, any two of the first floating electrodes 26b adjacent to each other may be electrically insulated from one another by the first insulation structure 16, and the gate 26a and the first floating electrodes 26b are electrically insulated from each other. Furthermore, since the first photoresist block 28a is used to define the position of the gate 26a of the LDMOS transistor 10, the first photoresist block 28a not only cover the semiconductor substrate 12 between the first well region 14 and the first insulation structure 16, but also further extend onto a portion of the first well region 14 serving as the base region. Accordingly, the formed gate 26a may overlap the first well region 14 in the vertical direction. Thereby, the overlapping portion of the first well region 14 and the gate 26a may be used as a channel of the LDMOS transistor 10. Preferably, the first photoresist block 28a may also extend onto a portion of the first insulation structure 16, so that the formed gate 26a extend onto the top surface of the first insulation structure 16.

In addition, since the second photoresist block 28b is used to define the position of the first floating electrodes 26b that protrudes from the top surface of the first insulation structure 16, the second photoresist block 28b at least covers one of the second trenches 16a closest to the first well region 14. Accordingly, the conductive layer 26 filling in the one of the second trenches 16a closest to the first well region 14 may be shielded by the second photoresist block 28b, and is not removed in the etching process. In this way, the one of the first floating electrodes 26b protruding from the top surface of the first insulation structure 16 can be formed. Preferably, the top surface of the one of the first floating electrodes 26b closest to the first well region 14 and the top surface of the gate 26a may be in a same plane.

In addition, for example, the width of the second photoresist block 28b may be at least less than the sum of twice the spacing between any two of the second trenches 16a adjacent to each other and the width of each of the second trenches 16a. The second photoresist block 28b does not overlap any two of the second trenches 16a adjacent to each other, such that the conductive layer 26 remaining under the second photoresist block 28b is not disposed in both two of the second trenches 16a adjacent to each other at the same time. Further, a second spacing G2 exists between the bottom surface of each of the first floating electrodes 26b and the bottom surface of the semiconductor substrate 12 under the first insulation structure 16, and at least two of the second spacings G2 may be different from each other, so that the heights H of at least another two of the first floating electrodes 26b are different from each other. In the present embodiment, since the depths D of the second trenches 16a are difficult to control and are different from one another, the second spacings G2 between the bottom surfaces of the first floating electrodes 26b and the semiconductor substrate 12 may be different from one another, but the present invention is not limited thereto. In another embodiment, the second spacings may be identical to each other. In the present embodiment, since the depths D of the second trenches 16a are not the same and the widths of the second trenches 16a are the same, the rate of etching the conductive layer 26 within the second trenches 16a are the same. Accordingly, the heights H of the others of the first floating electrodes 26b are different from each other except the one of the first floating electrodes 26b covered by the second photoresist block 28b, but not limited thereto. In another embodiment, the depths of at least another two of the second trenches may be identical to each other except the one of the second trenches closest to the first well region, and thus the heights of the at least another two of the first floating electrodes may be identical. In another embodiment, the widths of at least two of the second trenches are different, such that the widths of at least two of the first floating electrodes are different.

Furthermore, a third spacing G3 exists between any two of the first floating electrodes 26b adjacent to each other, which is determined by the spacing between any two of the second trenches 16a adjacent to each other. Since the spacings between the second trenches 16a may be the same, the third spacings G3 may be identical in the present embodiment. In another embodiment, the third spacings may not be identical, and at least two of the third spacings may be different from each other. In another embodiment, one of the spacings between two of the second trenches adjacent to each other may be larger or smaller than another spacing as the one of the spacings is closer to the first well region than the another spacing, and therefore one of the third spacings between two of the first floating electrodes adjacent to each other may be larger or smaller than another third spacing, as the one of the third spacings is closer to the first well region than the another third spacing.

As shown in FIG. 6, after the photoresist pattern 28 is removed, a spacer material layer (not shown) is blanket formed, and the spacer material layer fills up the second trenches 16a with the first floating electrodes 26b without protruding and the gap between the gate 26a and the one of the first floating electrodes 26b closest to the gate 26a. Subsequently, an etching back process is performed to form a first spacer 32a at a side of the gate 26a facing the first well region 14, to form a second spacer 32b between the gate 26a and the one of the first floating electrodes 26b closest to the gate 26a, to form a third spacer 32c on the sidewall of the one of the first floating electrodes 26b facing the second insulation structure 24, and to form an insulation block 34 in each of the second trenches 16a with the first floating electrodes 26b without protruding respectively. The gate structure 36 including the gate 26a, the gate dielectric layer 22a, the first spacer 32a and the second spacer 32b is formed accordingly. Then, an ion implantation process of the first conductivity type is performed to form a second doped region 38 including the first conductivity type in the first well region 14, and thereafter an ion implantation process of the second conductivity type is performed to form a contact doped region 40 including the second conductivity type in the second doped region 38 and the first well region 14.

Subsequently, an interlayer dielectric layer 42 is blanket formed to cover the semiconductor substrate 12. Those skilled in the art should be aware that contact plugs may be formed in the interlayer dielectric layer 42, and the contact plugs may be respectively electrically connected to the first doped region 18, the second doped region 38, the contact doped region 40 and the gate 26a, for electrically connecting the drain, the source and the gate of the LDMOS transistor electrode 10 to the corresponding devices. Thus, the LDMOS transistor 10 of the present embodiment is formed. In the present embodiment, the first spacer 32a, the second spacer 32b, the third spacer 32c and the insulation blocks 34 are constituted by an insulation material, such as silicon nitride (Si3N4) or silicon dioxide (SiO2), and may be a single layer or a composite structure. The second doped region 38 may be used as a source region of the LDMOS transistor 10. Further, each of the insulation blocks 34 may fill each of the second trenches 16a with the first floating electrodes 26b without protruding, so the first floating electrodes 26b embedded in the second trenches 16a may be completely electrically insulated from one another, and each of the first floating electrodes 26b is not electrically connected to any signal source and in a floating state. Furthermore, since the interlayer dielectric layer 42 covers the portion of the one of the first floating electrodes 26b closest to the gate 26a protruding from the first insulation structure 16, the one of the first floating electrodes 26b closest to the gate 26a and the gate 26a are only capacitively coupled to each other, but are not electrically connected to each other. In another embodiment, each of the insulation blocks may not fill up each of the second trenches, and each of the second trenches may be filled up by the interlayer dielectric layer.

In the present embodiment, the first conductivity type may be N-type and the second conductivity type is P-type, and the LDMOS transistor is an NMOS, but those skilled in the art should be aware that the first conductivity type and the second conductivity type can be exchanged, and LDMOS transistor is a PMOS, but not limited to those cases described in the present embodiment.

It is worth noting that, in the LDMOS transistor 10 of the present embodiment, since the first floating electrodes 26b are in the floating state and are embedded in the first insulation structure 16 sequentially arranged from the inner side to the outer side, and the one of the first floating electrodes 26b closest to the gate 26a protrudes from the top surface of the first insulation structure 16, as the first doped region 18 of the LDMOS transistor 10 is electrically connected to the high voltage power source 10, the first floating electrodes 26b may be capacitively coupled with the second well region 20 or the semiconductor substrate 12 under the first insulation structure 16, and the one of the first floating electrodes 26b closest to the gate 26a may be capacitively coupled with the gate 26a. Thus, a certain voltage drop may be provided between any two of the first floating electrodes 26b adjacent to each other, such that the voltage difference between the drain and the gate may be dispersed between the first floating electrodes 26b via the capacitive coupling between the first floating electrodes 26b and the second well region 20 or the semiconductor substrate 12, thereby preventing the high electric field from being concentrated on the area adjacent to the first doped region 18, the first insulation structure 16 and the second well region 20. Therefore, the LDMOS transistor 10 of the present embodiment may tolerate higher electric field, and the breakdown voltage thereof can be increased. Preferably, a first spacing G1 exists between the one of the first floating electrodes 26b closest to the first well region 14 and a first sidewall of the first insulation structure 16 facing the first well region 14, and the first spacing G1 is smaller than a half of a width W between the first sidewall of the first insulation structure 16 and a second sidewall of the first insulation structure 16 facing the first doped region 18, so that the one of the first floating gate electrodes 26b capacitively coupled with the second well region 20 or the semiconductor substrate 12 may be close enough to the gate 26a to generate capacitive coupling, which helps the voltage difference between the drain and gate to be dispersed between the first floating electrodes 26b. Further, in order to efficiently disperse the high voltage, the number of the second trenches 16a and the number of the first floating electrodes 26b filling the second trenches 16a are preferably larger, so that the voltage difference endured between any two of the first floating electrodes 26b adjacent to each other is lower, thereby increasing the breakdown voltage of the LDMOS transistor 10.

The LDMOS transistor and the manufacturing method thereof are not limited to the aforementioned embodiment, and may have other different preferred embodiments. To simplify the description, the identical components in each of the following embodiments are marked with identical symbols. For making it easier to compare the differences between the embodiments, the following description will detail the dissimilarities among different embodiments and the identical features will not be redundantly described.

Figure 7:
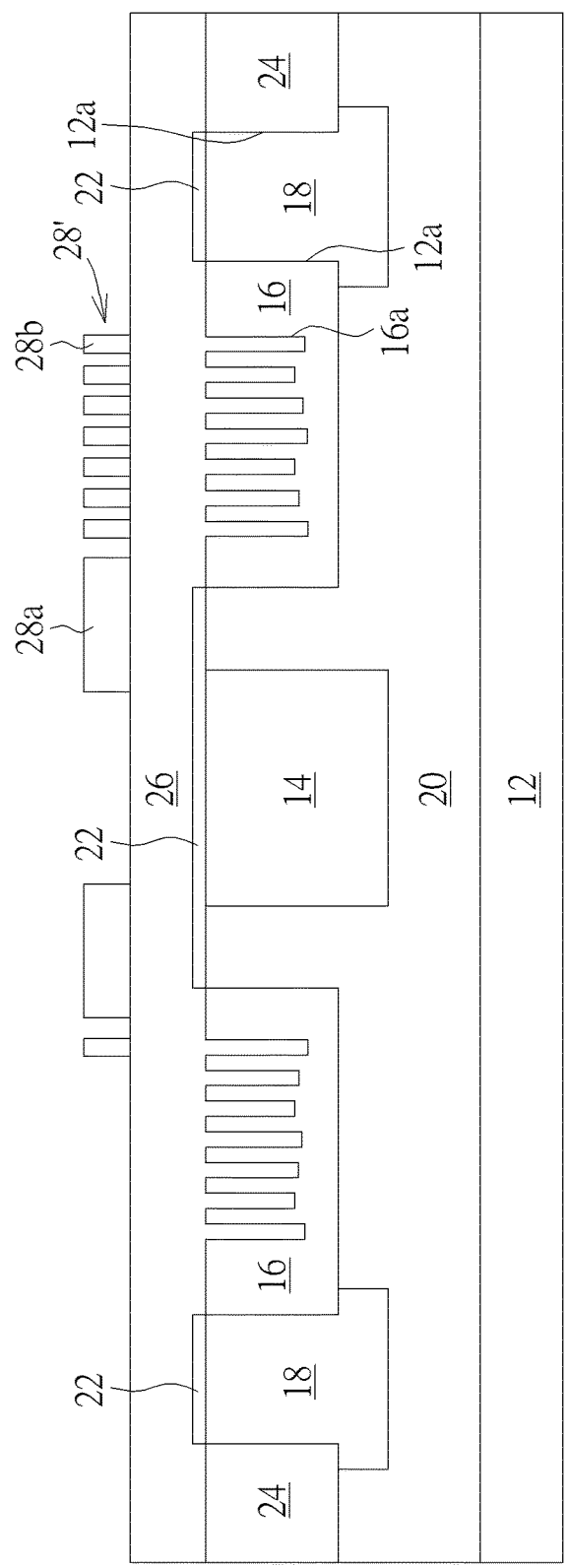
FIG. 7 and FIG. 8 are schematic diagrams illustrating a manufacturing method of an LDMOS transistor according to a second embodiment of the present invention.
Figure 8:
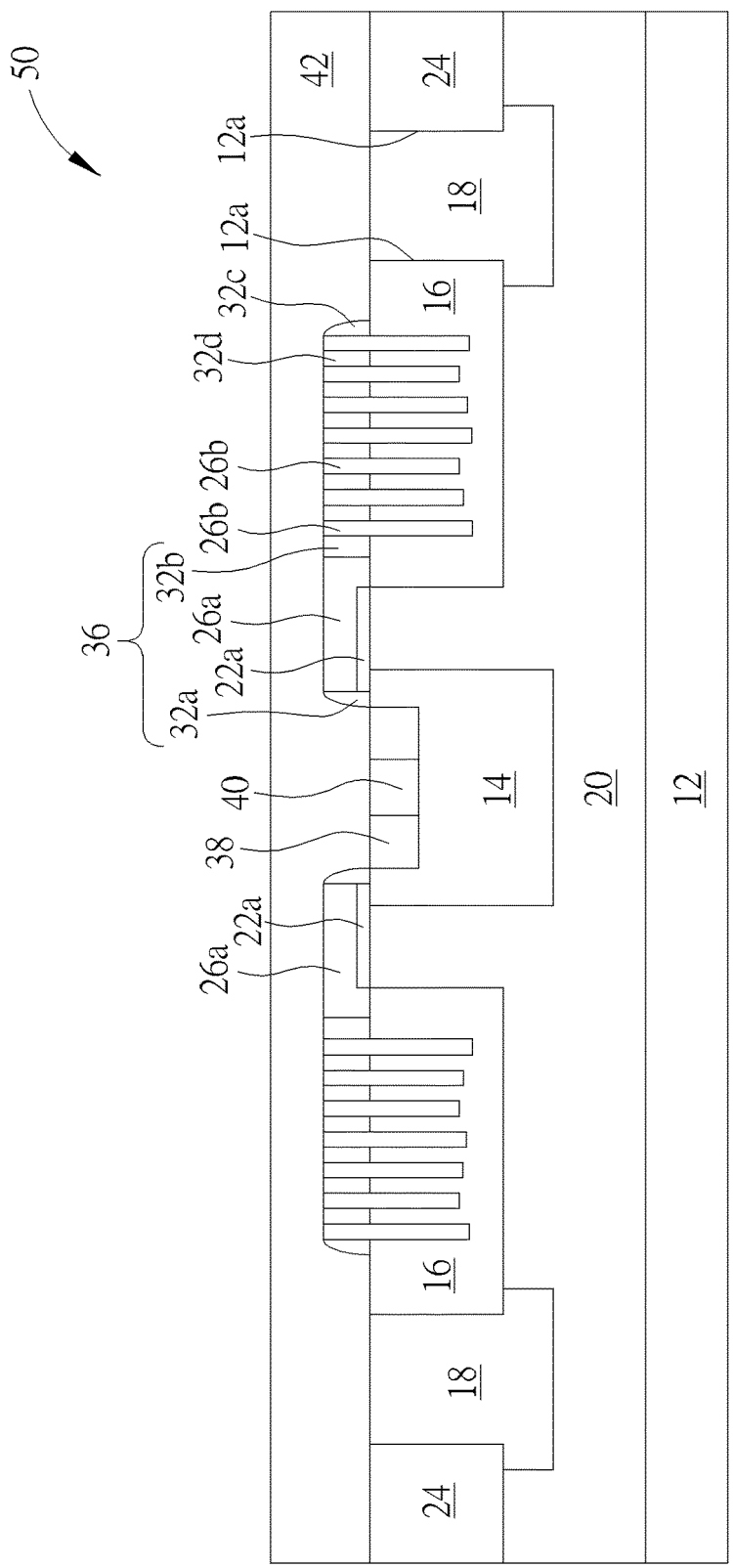

Please refer to FIGS. 7-8, which are schematic diagrams illustrating a manufacturing method of an LDMOS transistor according to a second embodiment of the present invention, wherein FIG. 8 is a cross-sectional view diagram illustrating the LDMOS transistor according to the second embodiment of the present invention. As shown in FIG. 7, the difference between the present embodiment and the first embodiment is that the photoresist pattern 28' includes a plurality of second photoresist blocks 28b, the number of the second photoresist blocks 28b equals the number of the second trenches 16a, and each of the second photoresist blocks 28b are disposed directly on and covers each of the second trenches 16a respectively in this embodiment. As shown in FIG. 8, in the step of patterning the conductive layer 26, all of the formed first floating electrodes 26b protrude from the top surface of the first insulation structure 16 respectively. In another embodiment, the number of the second photoresist blocks may be different from the number of the second trenches, and the photoresist pattern may include at least two second photoresist blocks. Thus, except the one of the first floating electrodes closest to the first well region, at least another one of the first floating electrodes may protrude from the top surface of the first insulation structure, and its position is determined by at least another one second photoresist block. Preferably, the at least another one of the first floating electrodes is disposed adjacent to the one of the first floating electrodes closest to the first well region.

After the conductive layer 26 is patterned, not only the first spacer 32a and the second spacer 32b may be formed, but also a fourth spacer 32d may be formed on the first insulation structure 16 between any two of the first floating electrodes 26b adjacent to each other, and the third spacer 32c may be formed on the sidewall of one of the first floating electrodes 26b closest to the first doped region 18 facing the first doped region 18. Since subsequent steps in the present embodiment are the same as the manufacturing method of the first embodiment, the subsequent steps will not be redundantly described. Thus, the LDMOS transistor 50 of the present embodiment is formed.

Figure 9:
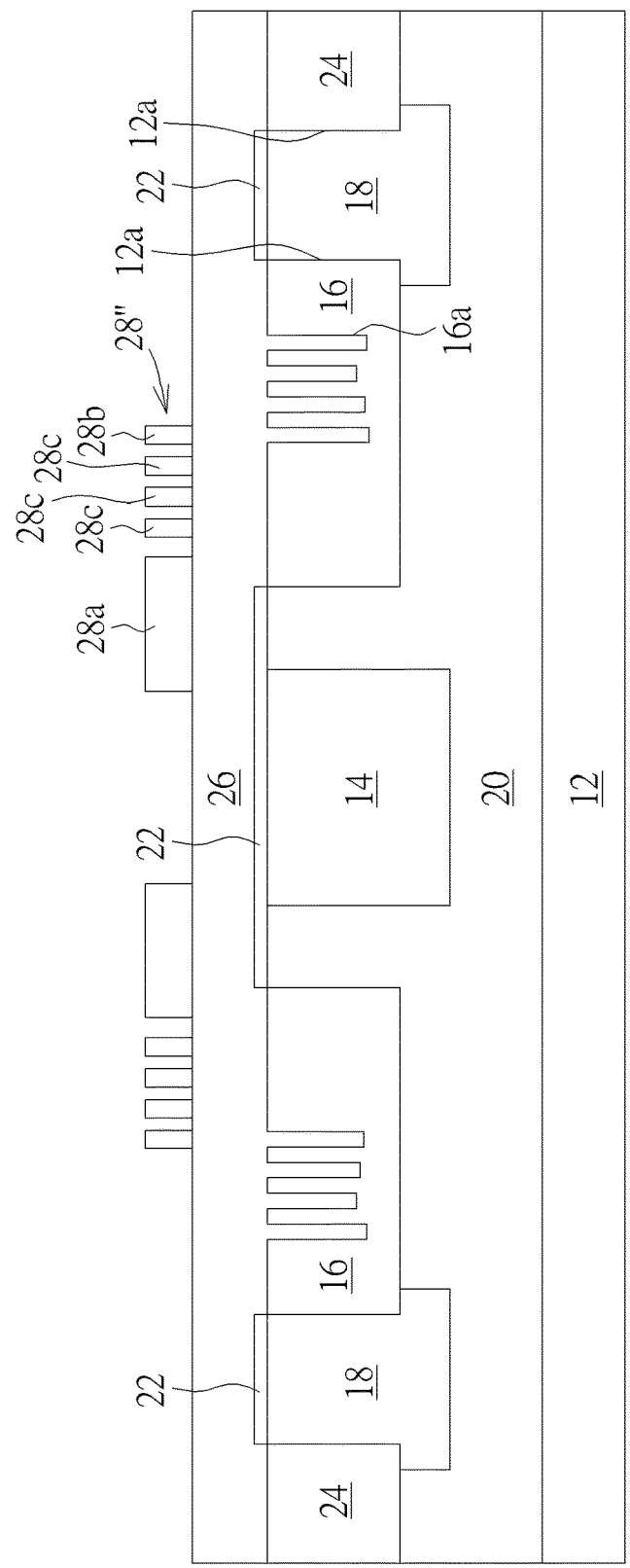
FIG. 9 and FIG. 10 are schematic diagrams illustrating a manufacturing method of an LDMOS transistor according to a third embodiment of the present invention.
Figure 10:
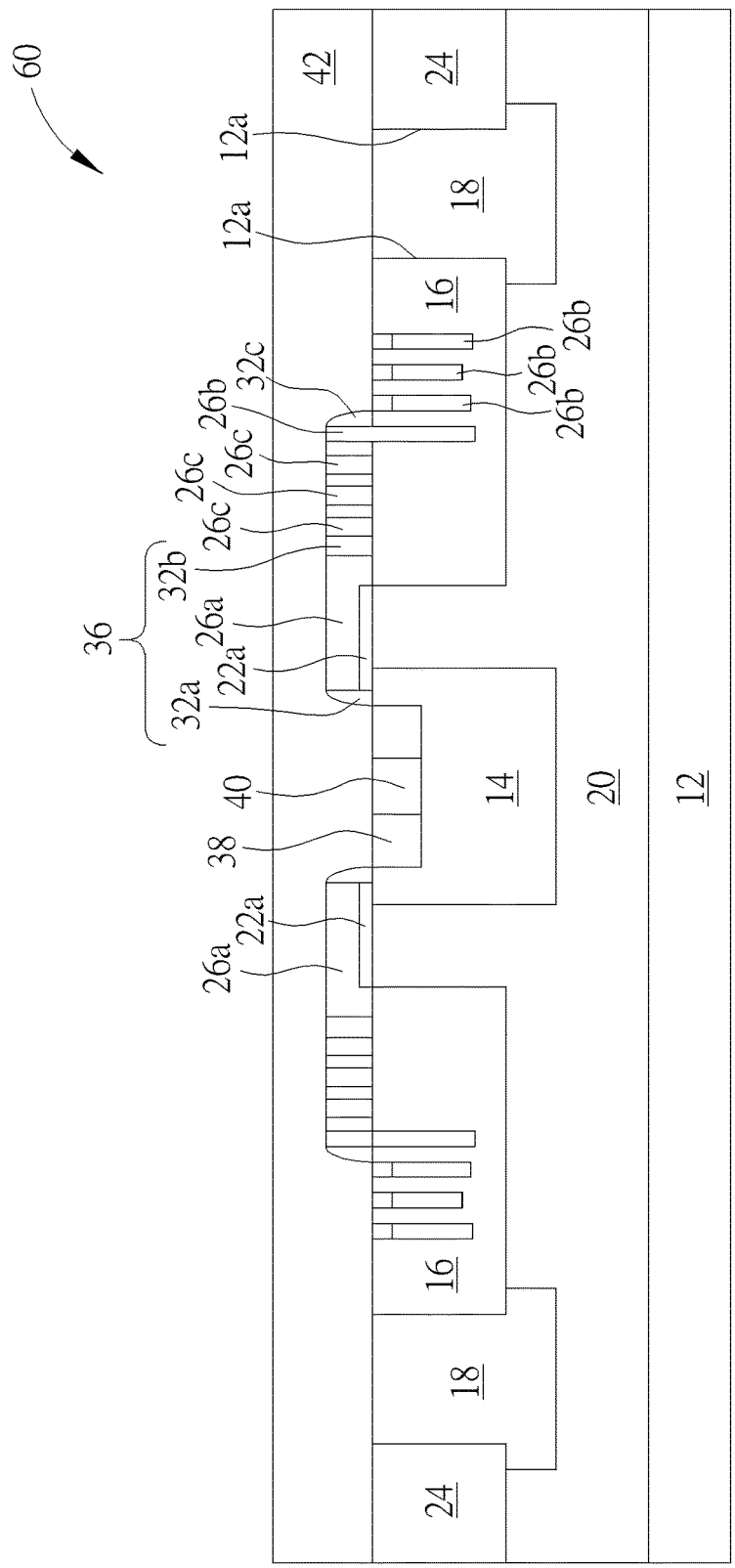

Refer to FIGS. 9-10, which are schematic diagrams illustrating a manufacturing method of an LDMOS transistor according to a third embodiment of the present invention, wherein FIG. 10 is a cross-sectional view diagram illustrating the LDMOS transistor according to the third embodiment of the present invention. As shown in FIG. 9, different from the first embodiment, the photoresist pattern 28" further includes at least a third photoresist block 28c, disposed on the top surface of the first insulation structure 16 between the first photoresist block 28a and the second photoresist block 28b and separated from the first photoresist block 28a and the second photoresist block 28b, and no second trench 16a is formed directly under the third photoresist block 28c in the present embodiment. As shown in FIG. 10, the step of the patterning conductive layer 26 further includes forming at least a second floating electrode 26c under the third photoresist block 28c, and the second floating electrode 26c is disposed on first insulation structure 16 between the first floating electrodes 26b and the gate 26a and separated and electrically insulated from the first floating electrodes 26b and the gate 26a. Since subsequent steps in the present embodiment are the same as the manufacturing method of the first embodiment, the subsequent steps will not be redundantly described. Thus, the LDMOS transistor 60 of the present embodiment is formed.

Figure 11:
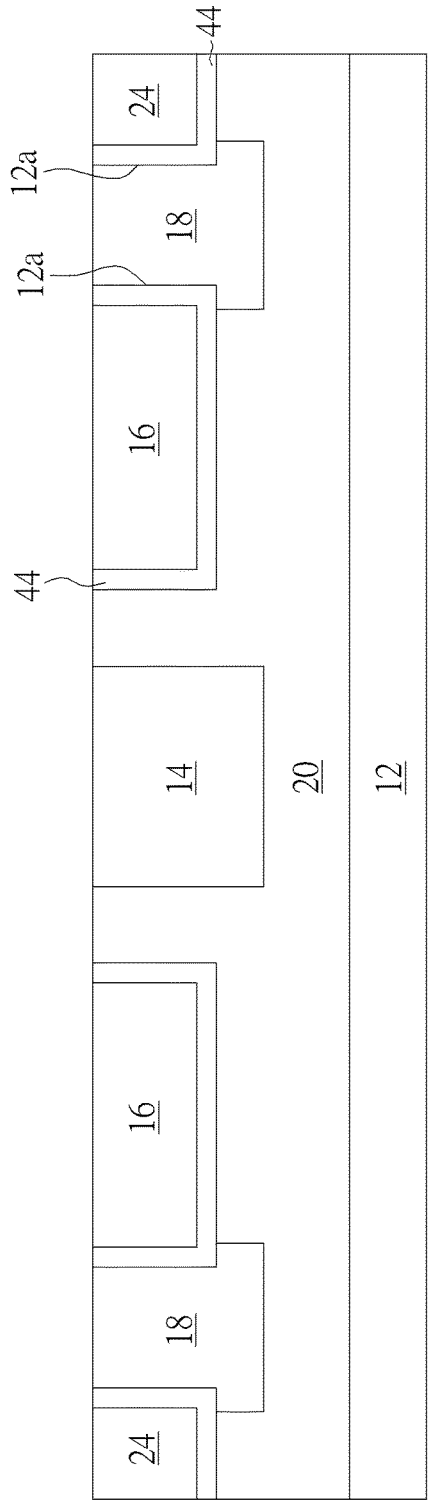
FIG. 11 and FIG. 13 are schematic diagrams illustrating a manufacturing method of an LDMOS transistor according to a fourth embodiment of the present invention.
Figure 12:
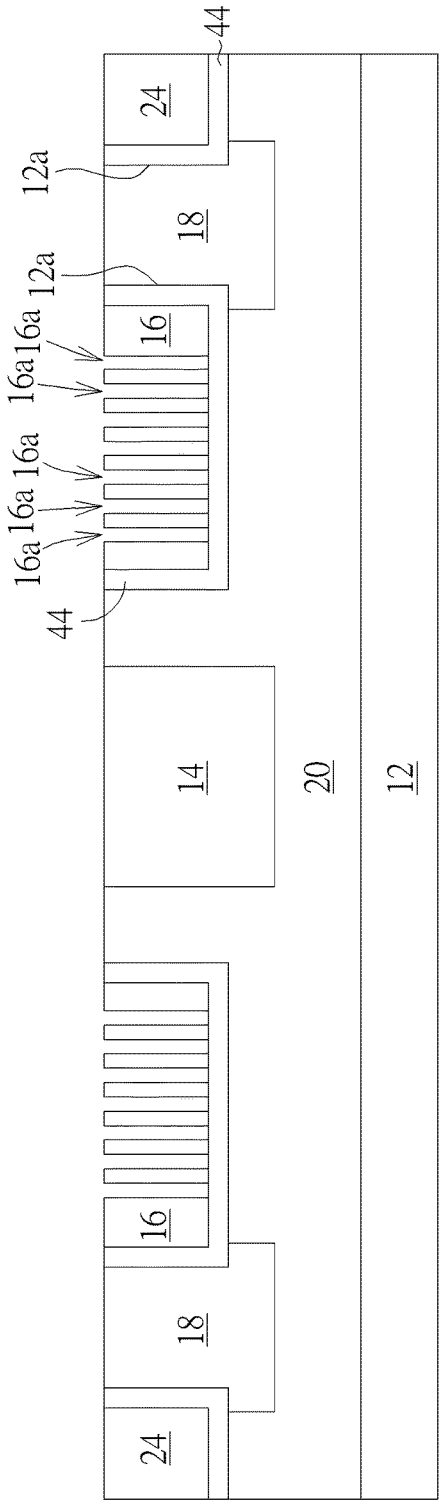
Figure 13:
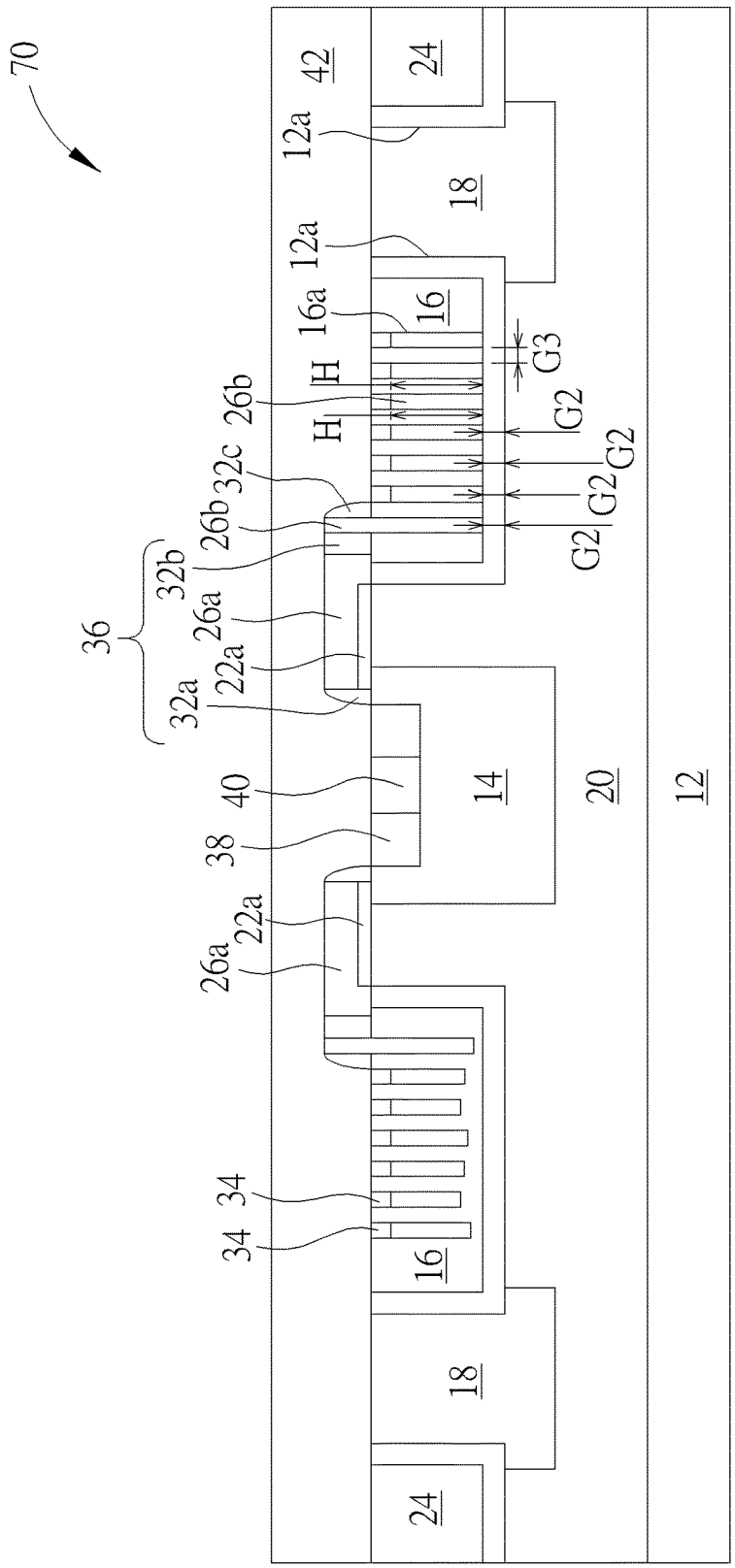

Refer to FIGS. 11-13, which are schematic diagrams illustrating a manufacturing method of an LDMOS transistor according to a fourth embodiment of the present invention, wherein FIG. 13 is a cross-sectional view diagram illustrating the LDMOS transistor according to the fourth embodiment of the present invention. As shown in FIG. 11, different from the first embodiment, the step of providing the semiconductor substrate 12 further includes providing a liner 44 between the first insulation structure 16 and the semiconductor substrate 12 in the present embodiment. In the present embodiment, the liner 44 may cover the bottom surface and the sidewalls of the first trench 12a after the first trench 12a is formed.

As shown in FIG. 12, a photolithography process and an etching process are performed to form a plurality of second trenches 16a in the first insulation structure 16. It is worth mentioning that the material of the liner 44 may include an etching stop material, such as a silicon nitride, and preferably, the material of the liner 44 may be different from the material of the first insulation structure 16, such that the liner 44 may be used as an etching stop layer. Accordingly, the step of forming the second trenches 16a may be performed to expose the liner 44, and the second trenches 16a pass through the first insulation structure 16. As a result, the thickness of the liner 44 may be used to determine the spacings between the bottom surfaces of the second trenches 16a and the semiconductor substrate 12 under the first insulation structure 16. For example, a thickness of the liner 44 may be between 50 angstroms to 100 angstroms. As shown in FIG. 13, the step of forming the gate 26a and the first floating electrodes 26b and the subsequent steps in the present embodiment are the same as the manufacturing method of the first embodiment, the subsequent steps will not be redundantly described. Thus, the LDMOS transistor 70 of the present embodiment is formed. It is worth noting that, since the second trenches 16a of the present embodiment pass through the first insulation structure 16, each of the second spacings G2 between the bottom surface of each of the first floating electrodes 26b and the semiconductor substrate 12 under the first insulation structure 16 are identical to the thickness of the liner 44. Accordingly, the second spacings G2 are the same. In this case, except the one of the first floating electrodes 26b closest to the gate 26a, the heights H of the first floating electrodes 26b are equal to each other. In another embodiment, the second trenches may not pass through the first insulation structure, and the first floating electrodes do not contact the liner. In another embodiment, the liner 44 may be a multilayer structure, such as a stack of an oxide layer and a nitride layer or a stack of an oxide layer, a nitride layer and another oxide layer.

Figure 14:
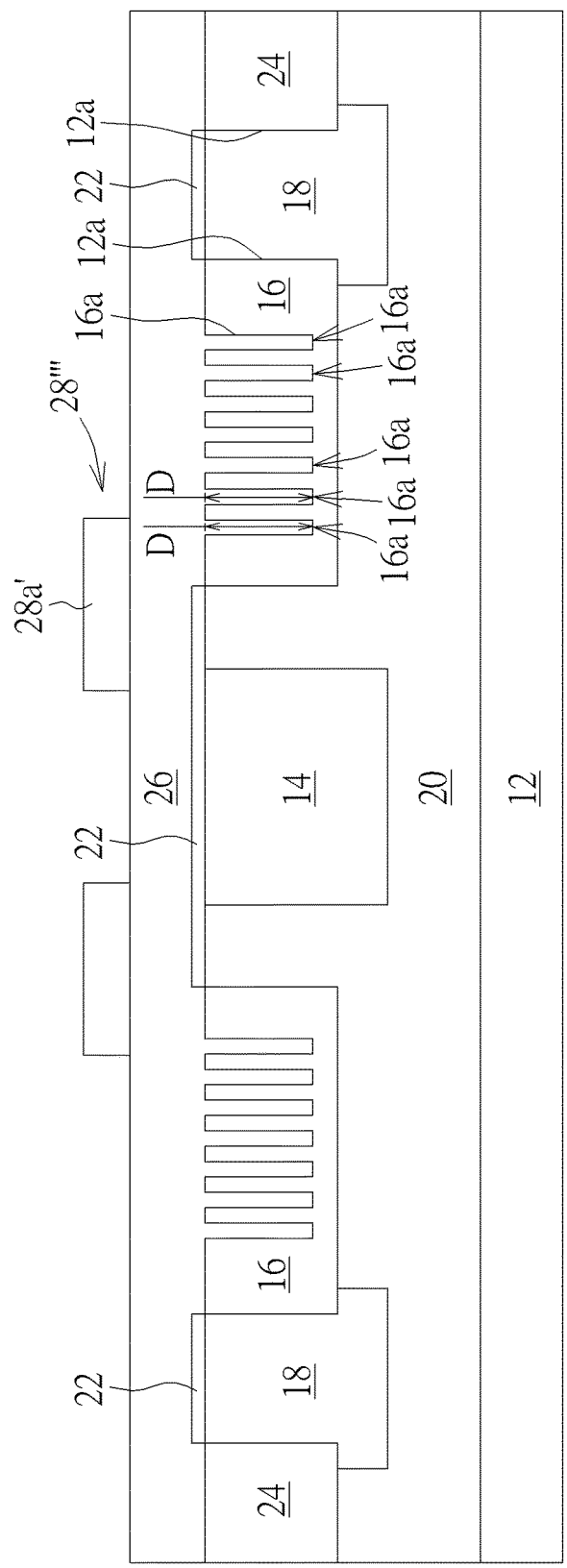
FIG. 14 and FIG. 15 are schematic diagrams illustrating a manufacturing method of an LDMOS transistor according to a fifth embodiment of the present invention.
Figure 15:
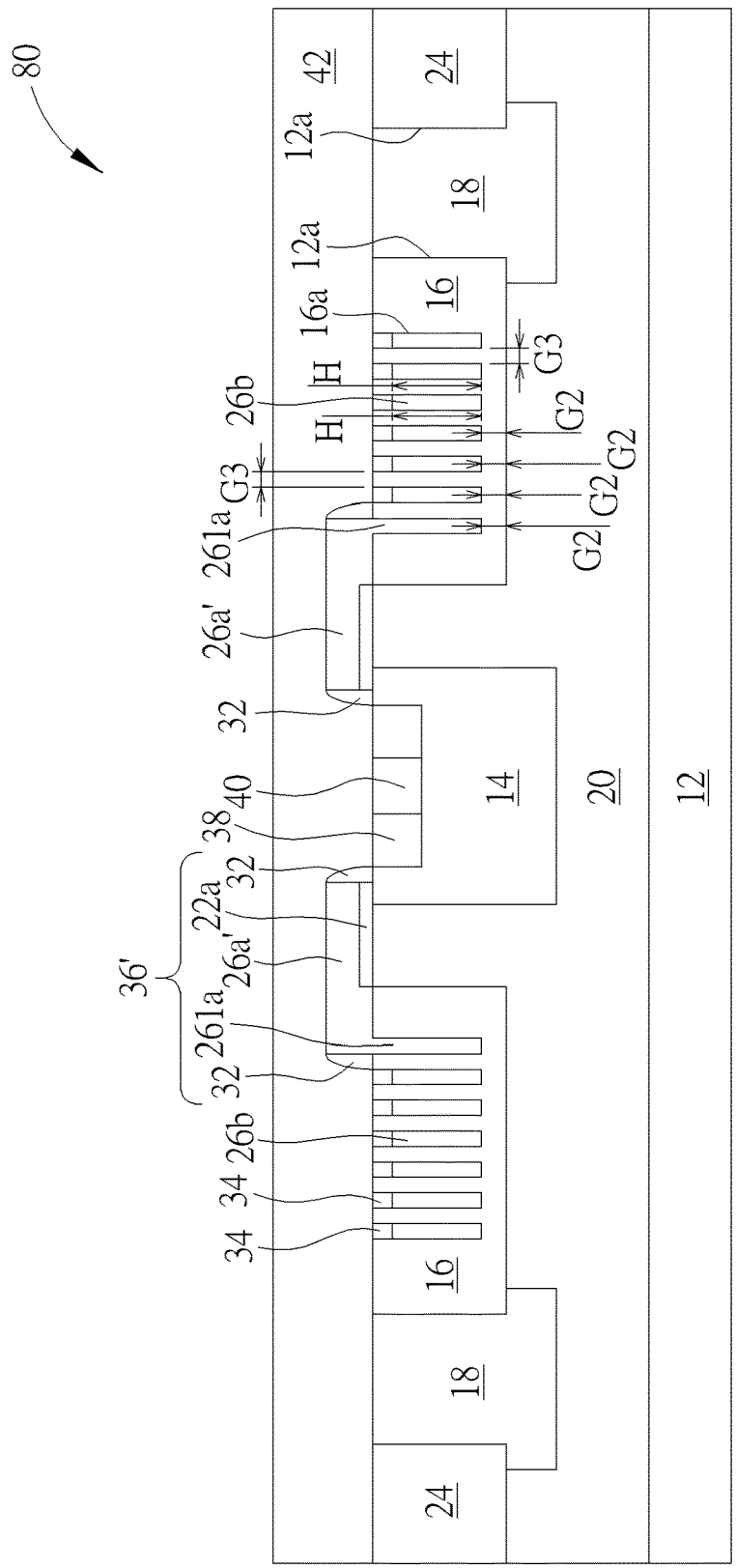

Refer to FIG. 14-15, which are schematic diagrams illustrating a manufacturing method of an LDMOS transistor according to a fifth embodiment of the present invention, wherein FIG. 15 is a cross-sectional view diagram illustrating the LDMOS transistor according to the fifth embodiment of the present invention. As shown in FIG. 14, different from the first embodiment, the photoresist pattern 28''' does not include a second photoresist block in the present embodiment, but merely include the first photoresist block 28a'. Also, the first photoresist block 28a' not only covers the semiconductor substrate 12 between the first well region 14 and the first insulation structure 16, but also extends to cover at least a second trench 16a adjacent to the first well region 14.

As shown in FIG. 15, after the photoresist pattern 28''' is formed, the first photoresist block 28a' is used as a mask to perform an etching process to form a gate 26a' and a plurality of first floating electrodes 26b, wherein the gate 26a' is formed on the first insulation structure 16. In the present embodiment, since the first photoresist blocks 28a' covers at least one second trench 16a adjacent to the first well region 14, the gate electrode 26a' formed under the first photoresist block 28a' includes at least a branch 261a, filling the at least one second trench 16a. The number of the second trenches 16a is greater than the number of the first floating electrodes 26b, such that the second trenches 16a may be filled with the branches 261a and the first floating electrodes 26b, respectively. The gate 26a' is separated from the first floating electrodes 26b, and is electrically insulated from the first floating electrodes 26b by the first insulation structure 16. In another embodiment, the first photoresist block may cover a plurality of second trenches, such that the gate may include a plurality of branches filling in the plurality of second trenches.

In the present embodiment, the depths D of the second trenches 16a may be identical to each other, and the second spacings G2 respectively exist between the bottom surface of branch 261a and the semiconductor substrate 12 under the first insulation structure 16 and the bottom surfaces of the first floating electrodes 26b and the semiconductor substrate 12 under the first insulation structure 16, and the second spacings G2 are identical to each other. Thereby, the heights H of the first floating electrodes 26b may be the same. In another embodiment, the depths of at least two of the second trenches 16a may be different from each other, so that at least two of the second spacings G2 may be different from each other, and the heights H of at least two of the first floating electrodes 26b are different from each other. In another embodiment, the step of providing the semiconductor substrate may further include providing a liner between the first insulation structure and the semiconductor substrate, and the step of forming the second trenches includes exposing the liner, such that the second spacing may be determined by the thickness of the liner, and may be identical to each other. In the present embodiment, a third spacing G3 exists between any two of the first floating electrodes 26b adjacent to each other, which may be determined by the spacing between any two of the second trenches 16a adjacent to each other, and the third spacings G3 of the present embodiment may be identical to each other. In another embodiment, the third spacings may not be identical, and at least two of the third spacings may be different from each other.

After the gate 26a' and the first floating electrodes 26b are formed, two spacers 32 may respectively be formed on two sides of the gate 26a, and an insulation block 34 may be formed in each of the second trenches 16a unfilled the branch 261a. The gate structure 36' including the gate 26a', the gate dielectric layer 22a and the spacers 32 is then formed. Since the subsequent steps after forming the spacers 32 in the present embodiment are the same as the manufacturing method of the first embodiment, the subsequent steps will not be redundantly described. Thus, the LDMOS transistor 80 of the present embodiment is formed.

Note that, the first photoresist block 28a' does not fully cover all of the second trenches 16a, thus a plurality of the first floating electrodes 26b may be formed in the second trenches 16a, so that the first floating electrodes 26b are embedded in the first insulation structure 16 between the gate 26a' and the first doped region 18. In addition, by the capacitive coupling between the branch 261a of the gate 26a' in the one of the second trenches 16a closest to the first well region 18 and the first floating electrodes 26b and the capacitive coupling between the first floating electrodes and the second well region 20 or the semiconductor substrate 12 under the first insulation structure 16, the voltage difference between the drain and gate is dispersed between the first floating electrodes 26b, such that the high electric field may be prevented from being concentrated on the area adjacent to the first doped region 18, the first insulation structure 16 and the second well region 20, and the breakdown voltage of the LDMOS transistor 80 may be increased. In order to efficiently disperse the high voltage, the number of the second trenches 16a and the number of the first floating electrode 26b filling the second trenches 16a are preferably larger, so that the withstood voltage difference between any two of the first floating electrodes 26b adjacent to each other is lower, and thus, the breakdown voltage of the LDMOS transistor 80 may be higher.

Figure 16:
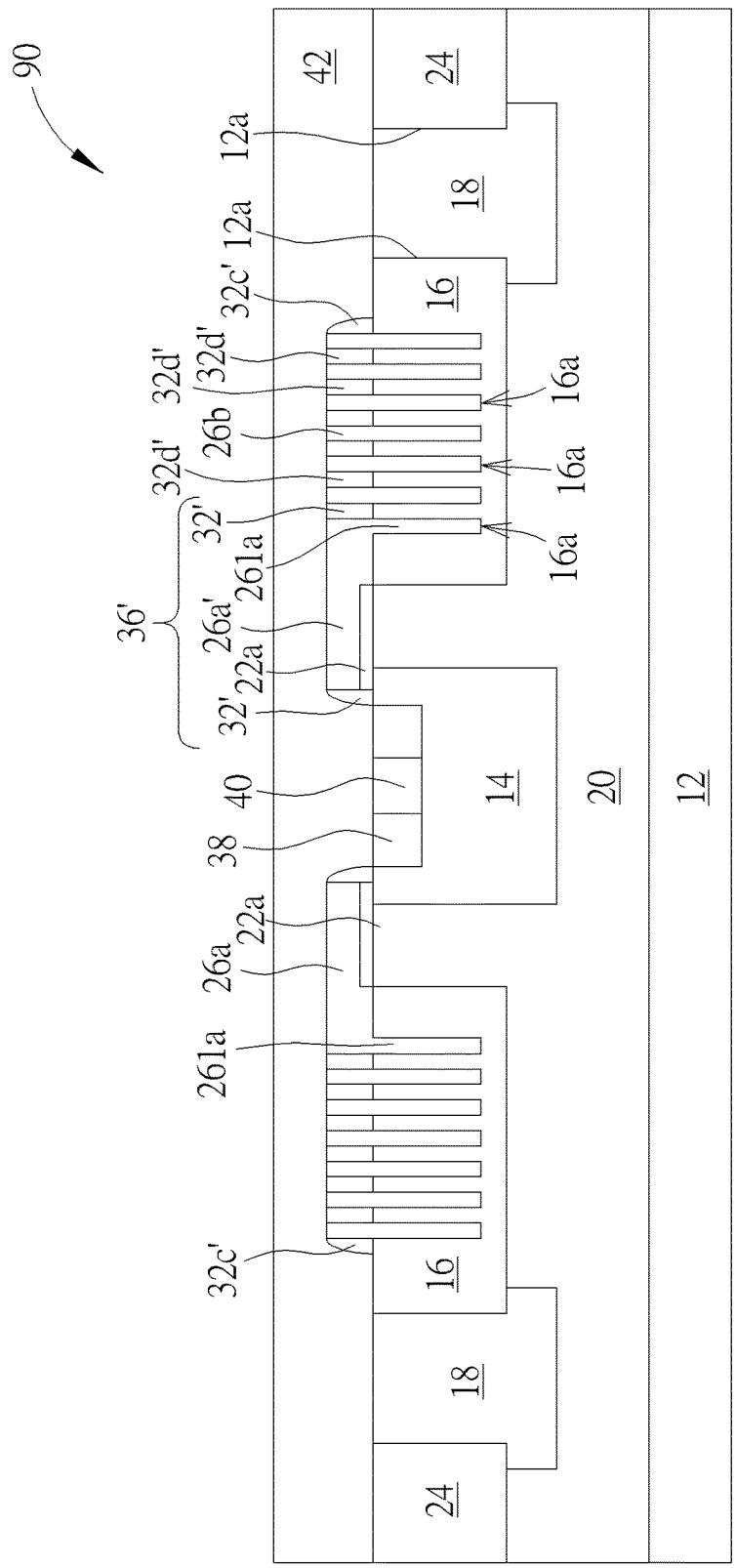
FIG. 16 is a cross-sectional view diagram illustrating an LDMOS transistor according to a sixth embodiment of the present invention.

Refer to FIG. 16, which is a cross-sectional view diagram illustrating an LDMOS transistor according to a sixth embodiment of the present invention. As shown in FIG. 16, different from the fifth embodiment, at least one of the first floating electrodes 26b may protrude from the top surface of the first insulation structure 16 of the present embodiment. Specifically, the photoresist pattern (not shown) of the present embodiment may include at least a second photoresist block separated from the first photoresist block, and the second photoresist block covers at least a second trench 16a unfilled the branch 261a. Thus, at least one of the first floating electrodes 26b protrudes from the top surface of the first insulation structure 16. In the present embodiment, all of the first floating electrodes 26b protrude from the top surface of the first insulation structure 16, but not limited thereto.

After the conductive layer is patterned, not only a spacer 32' may be formed, but also a fourth spacer 32d' may be formed on the first insulation structure 16 between any two of the first floating electrodes 26b' adjacent to each other, and a third spacer 32c' is formed on the sidewall of one of the first floating electrodes 26b closest to the first doped region 18 facing the first doped region 18. Since the subsequent steps of the present embodiment are the same as the manufacturing method of the first embodiment, the subsequent steps will not be redundantly described. Thus, the LDMOS transistor 90 of the present embodiment is formed.

In summary, in the LDMOS transistor of the present invention, since the floating electrodes are in the floating state and are embedded in the first insulation structure sequentially arranged from the inner side to the outer side, and one of the floating electrodes closest to the gate protrudes from the top surface of the first insulation structure, or the gate may include the branch embedded in the first insulation structure, the floating electrodes may be capacitively coupled with the second well region or the semiconductor substrate under the first insulation structure, and the one of the floating electrodes closest to the gate may be capacitively coupled with the gate. Thus, the voltage difference between the drain and the gate may be dispersed between the floating electrodes, and the breakdown voltage of the LDMOS transistor can be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A laterally diffused metal-oxide-semiconductor (LDMOS) transistor, comprising:
    a semiconductor substrate, comprising a first conductivity type;
    an insulation structure disposed in the semiconductor substrate, wherein the insulation structure has a continuous bottom surface;
    a well region disposed in the semiconductor substrate at a first side of the insulation structure, wherein the well region comprises a second conductivity type complementing the first conductivity type;
    a first doped region disposed in the semiconductor substrate at a second side of the insulation structure opposite the first side, wherein the first doped region comprises the first conductivity type;
    a second doped region disposed in the well region, wherein the second doped region comprises the first conductivity type;
    a gate structure disposed on the semiconductor substrate between the well region and the insulation structure, and the gate structure comprising a top surface; and
    a plurality of first floating electrodes embedded in the insulation structure and arranged from the first side to the second side, wherein one of the first floating electrodes closest to the well region protrudes from a top surface of the insulation structure, a top surface of the one of the first floating electrodes is coplanar with the top surface of the gate structure, the one of the first floating electrodes is longer than remaining floating electrodes, the top surface of the one of the first floating electrodes closest to the well region is higher than a top surface of the semiconductor substrate, a bottom surface of each of the first floating electrodes is lower than the top surface of the semiconductor substrate, the first floating electrodes are electrically insulated from each other and electrically insulated from the semiconductor substrate by the insulation structure, the first floating electrodes are separated from the gate structure, the continuous bottom surface of the insulation structure is disposed between the bottom surfaces of the first floating electrodes and the semiconductor substrate, and the continuous bottom surface of the insulation structure extends from a first sidewall of the insulation structure facing the well region to a second sidewall of the insulation structure facing the first doped region.

2. The LDMOS transistor according to claim 1, wherein a first spacing exists between the first floating electrode closest to the well region and the first sidewall of the insulation structure facing the well region, and the first spacing is smaller than a half of a width between the first sidewall of the insulation structure and the second sidewall of the insulation structure facing the first doped region.

3. The LDMOS transistor according to claim 1, wherein a second spacing exists between the bottom surface of each of the first floating electrodes and the semiconductor substrate under the insulation structure.

4. The LDMOS transistor according to claim 3, wherein at least two of the second spacings are different.

5. The LDMOS transistor according to claim 3, wherein each of the second spacings is between 50 angstroms to 100 angstroms.

6. The LDMOS transistor according to claim 1, wherein heights of at least another two of the first floating electrodes are different.

7. The LDMOS transistor according to claim 1, wherein a third spacing exists between any two of the first floating electrodes adjacent to each other, and the third spacings are equal to one another.

8. The LDMOS transistor according to claim 1, further comprising a liner disposed between the insulation structure and the semiconductor substrate, wherein the bottom surfaces of the first floating electrodes respectively contact the liner.

9. The LDMOS transistor according to claim 1, wherein the first doped region extends to contact the continuous bottom surface of the insulation structure.

10. The LDMOS transistor according to claim 1, wherein the continuous bottom surface of the insulation structure is a planar surface and is disposed entirely between the bottom surfaces of the first floating electrodes and the semiconductor substrate.

* * * * *